United States Patent
Kang et al.

(10) Patent No.: US 8,493,954 B2
(45) Date of Patent: Jul. 23, 2013

(54) METHOD AND APPARATUS FOR REDUCING DIGITAL TO ANALOG CONVERSION (DAC) BITS IN FREQUENCY DIVISION MULTIPLE ACCESS (FDMA) SYSTEM

(75) Inventors: Jun-Kyu Kang, Seoul (KR); In-Tae Kang, Seongnam-si (KR); Jeong-Gil Lee, Suwon-si (KR); Bo-Rham Lee, Seoul (KR); Sang-Min Bae, Suwon-si (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 826 days.

(21) Appl. No.: 12/337,702

(22) Filed: Dec. 18, 2008

(65) Prior Publication Data

US 2009/0154442 A1  Jun. 18, 2009

(30) Foreign Application Priority Data

Dec. 18, 2007  (KR) .................. 10-2007-0133073

(51) Int. Cl.
| | |
|---|---|
| H04L 27/08 | (2006.01) |
| H04B 7/208 | (2006.01) |
| H04B 1/44 | (2006.01) |
| H04B 7/204 | (2006.01) |
| H04B 1/04 | (2006.01) |
| H04B 1/06 | (2006.01) |
| H04B 7/00 | (2006.01) |
| H01Q 11/12 | (2006.01) |

(52) U.S. Cl.
USPC ............ 370/344; 370/282; 370/319; 375/345; 455/127.2; 455/239.1; 455/240.1; 455/245.1; 455/250.1

(58) Field of Classification Search
USPC ............ 370/282, 319, 344; 455/127.2, 127.4, 455/239.1, 240.1, 245.1, 250.1; 375/345
See application file for complete search history.

(56) References Cited

U.S. PATENT DOCUMENTS

| | | | |
|---|---|---|---|
| 6,369,735 B1 * | 4/2002 | Yang .......................... | 341/144 |
| 6,553,084 B1 * | 4/2003 | Maru .......................... | 375/345 |
| 7,187,314 B1 * | 3/2007 | Beamish et al. .............. | 341/144 |
| 7,729,420 B1 * | 6/2010 | Anvari ......................... | 375/232 |
| 2002/0118766 A1 * | 8/2002 | Mitlin et al. .................. | 375/261 |
| 2002/0126618 A1 * | 9/2002 | Kim ............................. | 370/208 |
| 2003/0103445 A1 * | 6/2003 | Steer et al. ................... | 370/208 |
| 2003/0123530 A1 * | 7/2003 | Maeda et al. ................ | 375/148 |
| 2003/0185311 A1 * | 10/2003 | Kim ............................. | 375/260 |
| 2003/0227964 A1 * | 12/2003 | Honkanen et al. ........... | 375/216 |
| 2004/0100898 A1 * | 5/2004 | Anim-Appiah et al. ..... | 370/210 |
| 2004/0141548 A1 * | 7/2004 | Shattil .......................... | 375/146 |

(Continued)

*Primary Examiner* — Ian N Moore
*Assistant Examiner* — Jenee Alexander
(74) *Attorney, Agent, or Firm* — Cha & Reiter, LLC

(57) ABSTRACT

A method and an apparatus for reducing Digital-to-Analog Conversion (DAC) bits at a transmitter of a Frequency Division Multiple Access (FDMA) system reduces a number of the bits for conversion so as to save power and reduce the cost of operation. The method can include generating a digital signal gain control value and an analog signal gain control value using subcarrier allocation information, a required Signal to Noise Ratio (SNR), and a Peak to Average Power Ratio (PAPR); controlling a gain of a signal input to a digital-to-analog converter using the digital signal gain control value; converting a digital signal of the controlled gain to an analog signal using the digital-to-analog converter; and restoring an original signal by controlling a gain of a signal output from the digital-to-analog converter using the analog signal gain control value.

16 Claims, 10 Drawing Sheets

U.S. PATENT DOCUMENTS

| | | | |
|---|---|---|---|
| 2004/0203983 A1* | 10/2004 | Klomsdorf et al. | 455/522 |
| 2004/0228283 A1* | 11/2004 | Naguib et al. | 370/252 |
| 2005/0068884 A1* | 3/2005 | Yoon et al. | 370/203 |
| 2005/0141406 A1* | 6/2005 | Maltsev et al. | 370/344 |
| 2005/0163154 A1* | 7/2005 | Matsuda | 370/463 |
| 2005/0175075 A1* | 8/2005 | Martin et al. | 375/149 |
| 2005/0213552 A1* | 9/2005 | Bar-Ness et al. | 370/342 |
| 2005/0265479 A1* | 12/2005 | Fujii et al. | 375/303 |
| 2006/0034401 A1* | 2/2006 | Cho et al. | 375/345 |
| 2007/0019537 A1* | 1/2007 | Paulraj | 370/203 |
| 2007/0133698 A1* | 6/2007 | Jung et al. | 375/260 |
| 2007/0291633 A1* | 12/2007 | Kim et al. | 370/203 |
| 2008/0019455 A1* | 1/2008 | Kim et al. | 375/260 |
| 2009/0103639 A1* | 4/2009 | Sankabathula et al. | 375/260 |

* cited by examiner

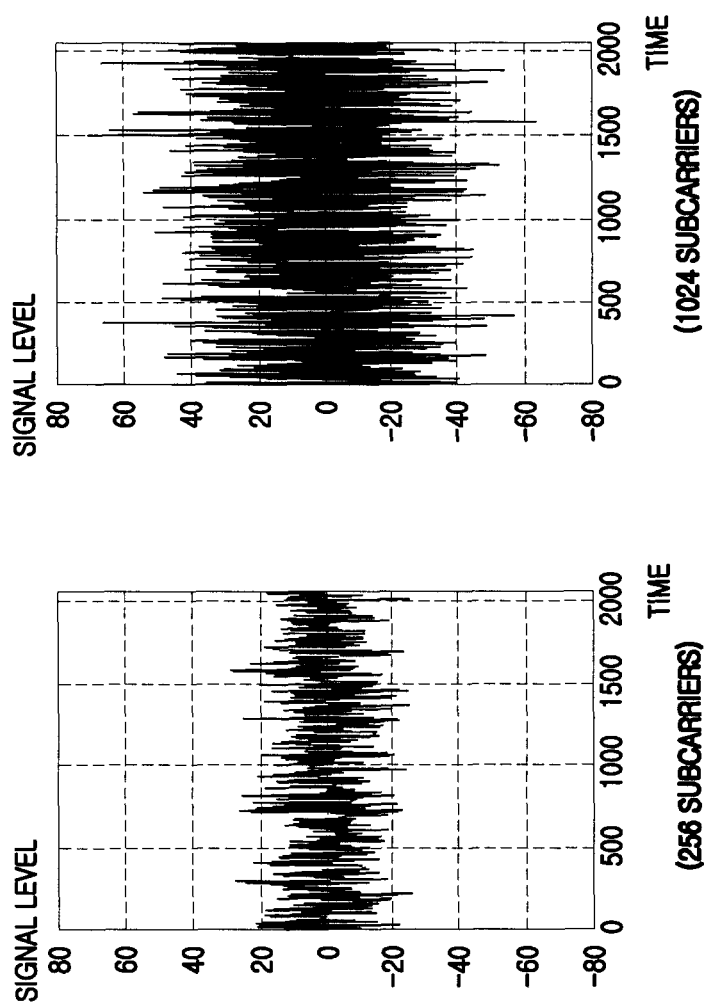

METHOD AND APPARATUS FOR REDUCING DIGITAL TO ANALOG CONVERSION (DAC) BITS IN FREQUENCY DIVISION MULTIPLE ACCESS (FDMA) SYSTEM

CLAIM OF PRIORITY

This application claims the benefit under 35 U.S.C. §119 (a) from a Korean patent application filed in the Korean Intellectual Property Office on Dec. 18, 2007 and assigned Serial No. 10-2007-0133073, the entire disclosure of which is hereby incorporated by reference in its entirety.

BACKGROUND OF THE INVENTION

1. Field of the Invention

The present invention relates generally to a method and an apparatus for reducing the number of bits required to convert a digital signal to an analog signal in a Frequency Division Multiple Access (FDMA) system using a subcarrier based allocation.

2. Description of the Related Art

In accordance with the recent increase in demands for not only voice communications, but also massive data services such as various multimedia Internet services in a wireless communication market, an Orthogonal Frequency Division Multiple Access (OFDMA) scheme and a Single Carrier Frequency Division Multiple Access (SC-FDMA) scheme are attracting more attention as possible wireless transmission techniques that may be used to meet those demands.

With regard to OFDMA, the OFDMA scheme typically converts serial data streams to N-ary parallel data streams and transmits the converted parallel data streams by allocating them to separate subcarriers as illustrated in FIG. 1A. The OFDMA scheme achieves efficient resource distribution by differing the number of the assigned subcarriers depending on a data rate requested by a user and avoids Inter-Symbol Interference (ISI) caused by a time delay spread by means of a Cyclic Prefix (CP). Hence, the OFDMA is quite efficient in a wireless communication system having a relatively wider cell. Disadvantageously, since the signals corresponding to the multiple subcarriers are mixed at the transmitter, the OFDMA scheme is also subject to a considerable Peak to Average Power Ratio (PAPR) of the signal.

Similar to the OFDMA scheme, the SC-FDMA scheme transmits data per subcarrier. As illustrated in FIG. 1B, the SC-FDMA scheme conducts a Discrete Fourier Transform (DFT) 110 before an Inverse Fast Fourier Transform (IFFT), to thus lower the PAPR, which is the shortcoming of the above-described OFDMA scheme. The OFDMA maps the data in the frequency domain prior to the IFFT, whereas the SC-FDMA maps the data in the time domain prior to the DFT 110 preceding the IFFT. Since the mapped data are transmitted with the single carrier characteristic sustained, the PAPR is reduced in spite of the multicarrier. The SC-FDMA scheme is determined as the standard of the $3^{rd}$ Generation Partnership Protect (3GPP) Long Term Evolution (LTE) uplink which is a future communication system. Both the OFDMA and the SC-FDMA allow the data allocation per subcarrier within a symbol. This SC-FDMA scheme method can acquire efficiency by broadening the width of the data allocation, but disadvantageously at the expense of increasing the signal dynamic range; that is, the variation of the signal level.

For example, referring now to FIGS. 2A and 2B, in the OFDMA scheme, the transmit signal power level in the data allocation to 1024 subcarriers of FIG. 2B is greater than the transmit signal power level in the data allocation to 256 subcarrier of FIG. 2A. The greater number of the assigned subcarriers, the greater energy of the signal transmitted in the same time.

In a system requiring the high-speed data transmission such as OFDMA system and SC-FDMA system, the increase of the transmission bandwidth increases the size of a Fast Fourier Transform (FFT) and also raises the ratio of maximum allocated subcarriers to minimum allocated subcarriers; that is, the allocation ratio.

In a conventional system, the allocation ratio affects the number of bits needed to convert the digital signal to the analog signal (hereinafter, referred to as a Digital-to-Analog Conversion (DAC) bits). Accordingly, the higher allocation ratio requires a greater number of DAC bits.

The number of the DAC bits in the conventional system varies according to the allocation ratio as expressed in Equation (1).

$$\text{DAC bits} = \text{ceil}(\text{ENOB}) + 1$$

$$\text{ENOB} = (Psig - 1.76)/6.02$$

$$Psig(\text{dB}) = \text{SNRreq}(\text{dB}) + \text{PAPR}(\text{dB}) + Ralloc(\text{dB}) + \text{Margin}(\text{dB}) \quad (1)$$

In Equation (1), "ceil" denotes a function which rounds up to the nearest integer, ENOB denotes the effective number of bits, and +1 denotes a value corresponding to a sign bit. Psig denotes a dB scale value, SNRreq(dB) denotes a required Signal to Noise Ratio (SNR), and PAPR(dB) denotes a Peak to Average Power Ratio (PAPR) of the signal. Ralloc(dB) denotes a ratio of minimum allocated subcarriers to maximum allocated subcarriers of the signal and Margin(dB) denotes a margin in consideration of noise and distortion caused by nonlinear characteristic of the DAC.

Now referring to FIG. 3, to calculate the number of the DAC bits required at the transmitter based on Equation (1), Psig(dB) 311 is obtained by summing up SNRreq(dB) 305, PAPR(dB) 303, Ralloc(dB) 301, and Margin(dB) 307 and converted to ENOB 313. The converted ENOB 313, which will undergo DAC conversion 315, is rounded up to its nearest integer to produce the effective bits 317 and added with the sign bit 319. As a result, the number of the DAC bits 315 can be converted. For example, given SNRreq 30 dB, PAPR 10 dB, Ralloc 20 dB, and Margin 10 dB, Psig is 70 dB, ENOB is 11.34, and the effective bit is 12. Accordingly, the DAC bit is 13 including the sign bit 1. Herein, when the required SNR, the PAPR, and the allocation ratio Ralloc indicative of the signal characteristics need to transmit a plurality of different signals, the number of the required DAC bits is determined based on the signal having the greatest Psig value among the different signals.

As discussed above, the conventional method determines the number of the DAC bits in consideration of the subcarrier allocation ratio and the number of the DAC bits of the transmitter is set to the number of bits required in the highest subcarrier allocation ratio. However, since the subcarrier allocation ratio is variable, every DAC bit is not used in case of lesser allocations. In great allocations, the number of bits greater than needed is not utilized. As a result, the efficiency degrades for the number of the DAC bits designed. The degraded efficiency ultimately increases the unit cost of the DAC, the power consumption, and the hardware size due to the increased filter bits. Thus, there is a need in the art to provide a method for reducing the DAC bits without degrading the performance.

SUMMARY OF THE INVENTION

An exemplary aspect of the present invention is to provide a method and an apparatus for reducing the number of bits required to convert a digital signal to an analog signal in a Frequency Division Multiple Access (FDMA) system using a per subcarrier allocation.

Another exemplary aspect of the present invention is to provide a method and an apparatus for reducing a hardware size and a power consumption by decreasing the number of bits of a digital-to-analog converter in an FDMA system using a per subcarrier allocation.

Yet another exemplary aspect of the present invention is to provide a method and an apparatus for regulating a gain of a signal input to a digital-to-analog converter to decrease the number of Digital-to-Analog Conversion (DAC) bits at a transmitter of an FDMA system using a per subcarrier allocation.

The above exemplary aspects are achieved by providing a method for reducing DAC bits at a transmitter of an FDMA system. The method may include, for example, generating a digital signal gain control value and an analog signal gain control value using subcarrier allocation information, a required Signal to Noise Ratio (SNR), and a Peak to Average Power Ratio (PAPR); controlling a gain of a signal input to a digital-to-analog converter using the digital signal gain control value; converting a digital signal of the controlled gain to an analog signal using the digital-to-analog converter; and restoring an original signal by controlling a gain of a signal output from the digital-to-analog converter using the analog signal gain control value.

According to another exemplary aspect of the present invention, an apparatus for reducing DAC bits at a transmitter of an FDMA system includes a dynamic range preprocessor for generating a digital signal gain control value and an analog signal gain control value using subcarrier allocation information, a required SNR, and a PAPR; a digital gain normalizer for controlling a gain of a signal input to a digital-to-analog converter using the digital signal gain control value; the digital-to-analog converter for converting a digital signal of the controlled gain to an analog signal; and an analog gain compensator for restoring an original signal by controlling a gain of a signal output from the digital-to-analog converter using the analog signal gain control value.

Other exemplary aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other exemplary aspects, features and advantages of certain exemplary embodiments the present invention will become more apparent from the following detailed description taken in conjunction with the accompanying drawings, in which:

FIG. 2 is a graph showing a signal power level based on a subcarrier allocation size in a conventional method;

Throughout the drawings, like reference numerals will be understood to refer to like parts, components and structures.

DETAILED DESCRIPTION

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions may be omitted for clarity and conciseness so as not to obscure appreciation of the subject matter of the present invention by a person of ordinary skill in the art.

Exemplary embodiments of the present invention provide a method and an apparatus for reducing the number of bits required to convert a digital signal to an analog signal by regulating a gain of a signal to control a power level of the signal input to a digital-to-analog converter at a transmitter of a Single Carrier Frequency Division Multiple Access (SC-FDMA) system or an Orthogonal Frequency Division Multiple Access (OFDMA) system.

Figure 1A:
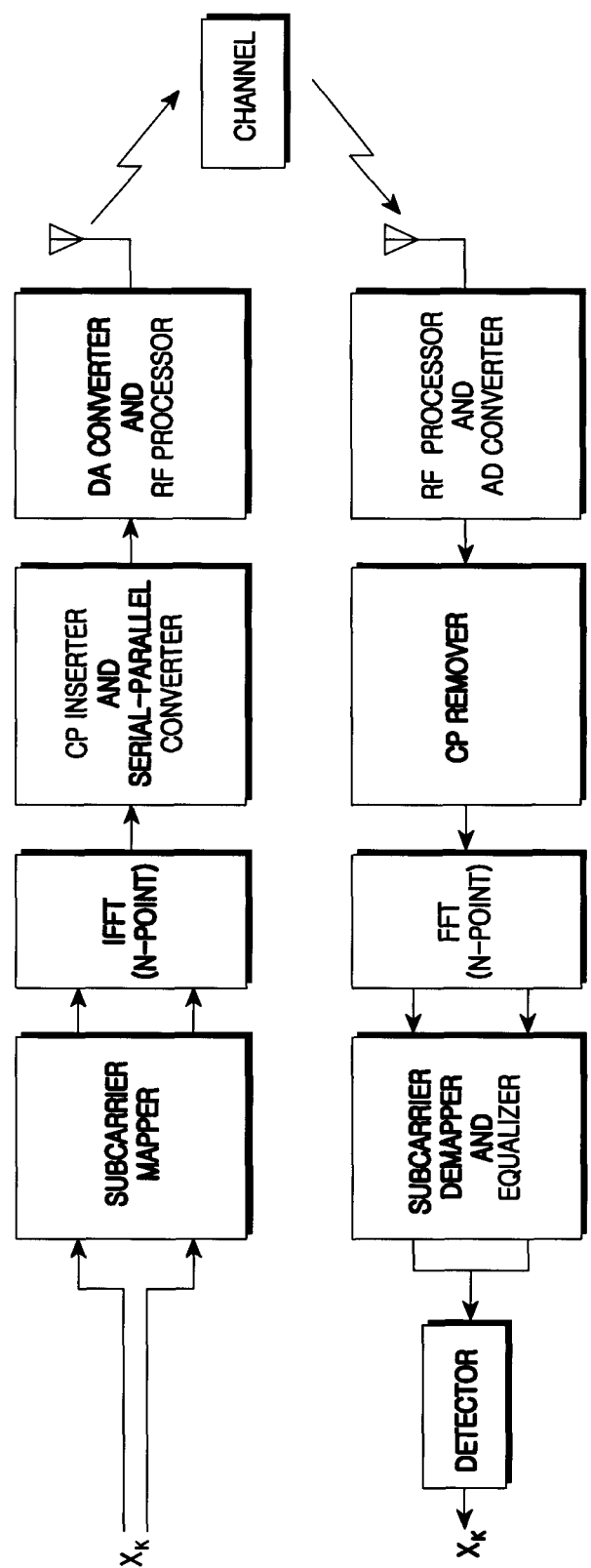
FIG. 1 is a block diagram of a transmitter and a receiver in a Orthogonal Frequency Division Multiple Access (OFDMA) system and a Single Carrier Frequency Division Multiple Access (SC-FDMA) system.
Figure 1B:
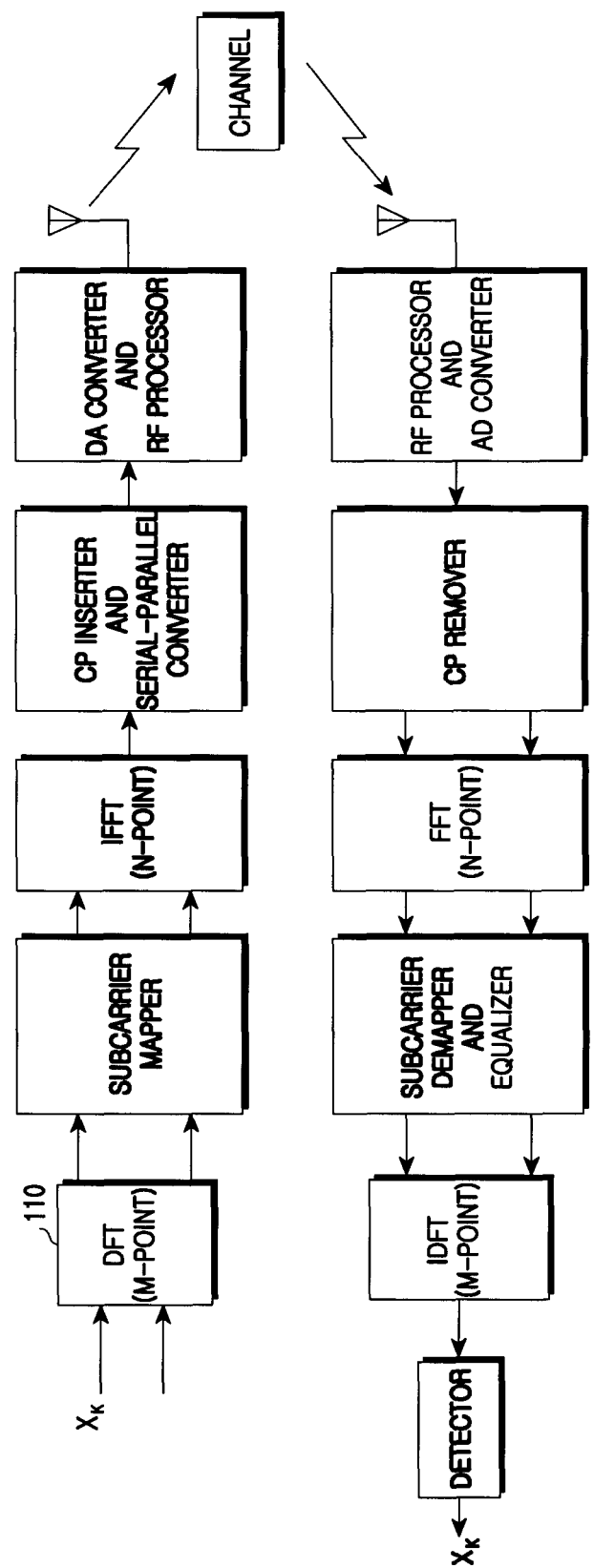
Figure 3:
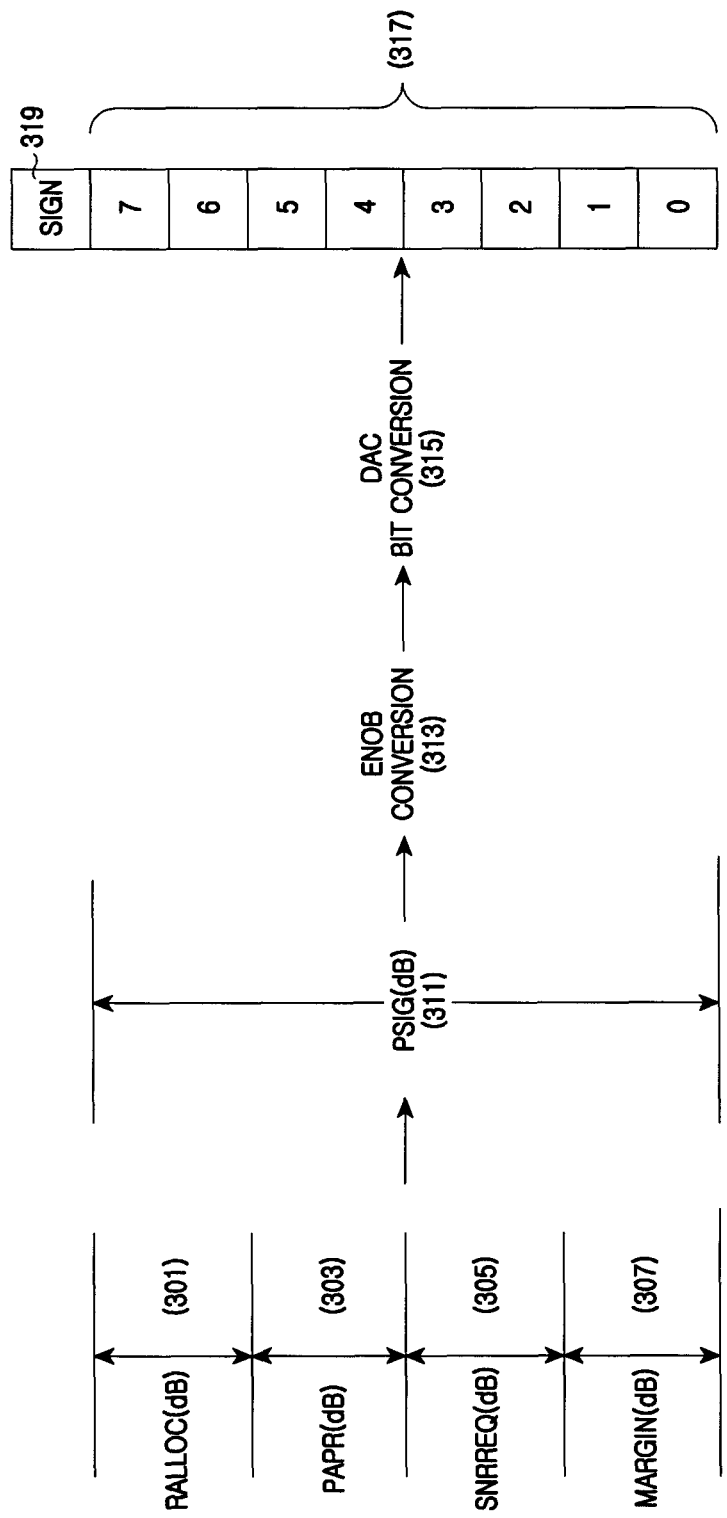
FIG. 3 is a diagram of a conventional determination method of the number of Digital/Analog Conversion (DAC) bits.
Figure 4:
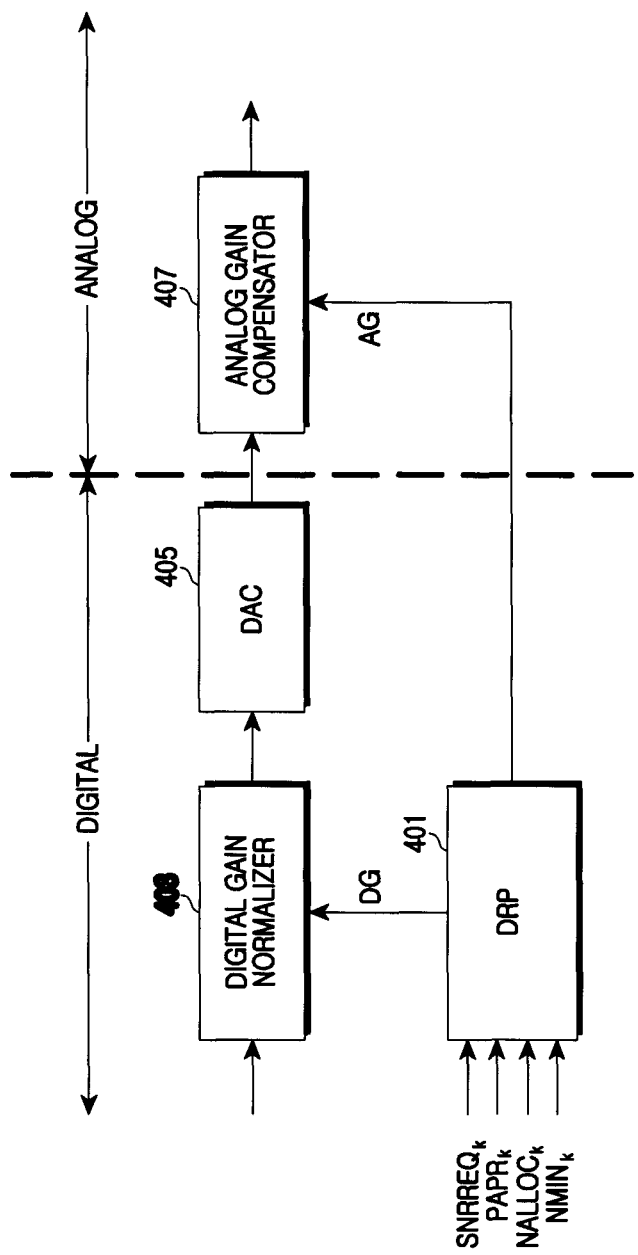
FIG. 4 is a block diagram of a transmitter for regulating a signal gain in an FDMA system according to an exemplary embodiment of the present invention.

FIG. 4 is a block diagram of a transmitter for regulating a signal gain in an FDMA system according to an exemplary embodiment of the present invention. Now referring to FIG. 4, the transmitter includes a Dynamic Range Preprocessor (DRP) 401, a digital gain normalizer 403, a Digital-to-Analog Converter (DAC) 405, and an analog gain compensator 407.

At the front end of the DAC 405, the DRP 401 controls and processes to regulate a signal gain to maintain the signal power at a constant level regardless of a signal type and an allocation amount, using a required Signal to Noise Ratio (SNR), a Peak to Average Power Ratio (PAPR), a ratio of minimum allocated subcarriers to maximum allocated subcarriers (hereafter, referred to as a Ralloc), and a margin value in consideration of noise and distortion caused by nonlinear characteristic of the DAC 405.

In more detail, the DRP 401 typically receives the SNR, the PAPR, the Ralloc, and the margin value and generates a Digital Gain (DG) for controlling the gain of the signal input to the DAC 405 and an Analog Gain (AG) for compensating for the signal gain output from the DAC 405. Since the signal input to the DAC 405 is a digital signal, the input signal is regulated and normalized according to the DG The signal output from the DAC 405, which is an analog signal, is regulated and compensated according to the AG.

Depending on whether there are signals of a single type, or various types, within a Transmission Time Interval (TTI) which is a minimum allocation interval, the DRP 401 may generate the DG and the AG in a number of different ways When there is a signal $Sig_1$ of one type in one TTI, the DRP 401 generates the DG and the AG using only the subcarrier allocation information as expressed in Equation (2). It is assumed that the subcarrier allocation amount is not changed in the TTI.

$$DG(dB) = -10*\log(Nalloc/Nmin)$$

$$AG(dB) = -DG(dB) \quad (2)$$

In Equation (2), Nalloc denotes the number of subcarriers currently allocated and N min denotes the minimum number of subcarriers allocated; that is, a minimum allocation subcarrier unit.

On account that the signal type and the subcarrier allocation information may change per TTI, the DRP 401 generates and updates the DG and the AG per TTI based on Equation (2).

When there are signals $Sig_k$ (k=1, 2, ..., N) of various types in one TTI, the DRP 401 identifies a signal requiring the greatest number of DAC bits among the various signals based on Equation (3) (introduced hereinbelow), and calculates the DG and the AG for the signal gain control based on Equation (4) or Equation (5) (both introduced hereinbelow), depending on whether the corresponding signal requires the greatest number of the DAC bits. It is assumed that different signals are present in one TTI per symbol and that the allocation amount of the signals of the same type is not changed. It is assumed that for this example the individual signals pass through a time division multiplexing within the TTI, the signal of one particular type is allocated to one symbol, and the margin value is constant regardless of the signal type because the margin is determined by the characteristic of the DAC 405.

Equation (3) identifies the signal requiring the greatest number of DAC bits among the various signals in one TTI.

$$M = \underset{k}{\mathrm{argmax}}(SNRreqk_k(dB) + PAPR_k(dB)), k = 1, 2, \ldots, N \quad (3)$$

In Equation (3), M denotes an index of the signal requiring the greatest number of DAC bits among the various signals in the TTI, $$\underset{k}{\mathrm{argmax}}()$$

denotes a function indicative of a value k which maximizes the value in a parenthesis, $SNRreqk_k$ denotes a required SNR of the signal of the index k, and $PAPR_k$ denotes a PAPR value of the signal of the index k.

After determining the signal k ($Sig_k$) requiring the greatest number of DAC bits to M based on Equation (3), the DRP 401 calculates the DG and the AG of the signal determined to M based on Equation (4) and calculates the DG and the AG for the signal not determined to M based on Equation (5).

Equation (4) calculates the DG and the AG when the index k of the signal is M and Equation (5) calculates the DG and the AG when the index k of the signal is not M.

$$DG_k(dB) = -10*\log(Nalloc_k/Nmin_k), \text{ in case of } k = M$$

$$AG_k(dB) = -DG_k(dB) \quad (4)$$

$$DG_k(dB) = (SNRreq_M(dB) + PAPR_M(dB)) - (SNRreq_k(dB) + PAPR_k(dB)) + 10*\log(Nalloc_k/Nmin_k), \text{ in case of } k \neq M$$

$$AG_k(dB) = -DG_k(dB) \quad (5)$$

Since the allocation information of the various signals respectively are provided individually per TTI, the DRP 401 generates both the DG and the AG per TTI based on Equation (4) and Equation (5), and updates the generated DG and AG right before the signal type changes. The DG and the AG can be updated symbol by symbol, which is the minimum unit of the signal type change.

The digital gain normalizer 403 receives the DG from the DRP 401 and normalizes to a constant power level by regulating the gain of the signal input to the DAC 405. That is, the digital gain normalizer 403 controls the power level of the signal to the level of the minimum allocation, regardless of the allocation amount, by controlling the signal gain using the DG.

The DAC 405 receives the digital signal normalized to the constant power level from the digital gain normalizer 403 and converts the digital signal to an analog signal.

Still referring to FIG. 4, the analog gain compensator 407 receives the AG from the DRP 401 and restores the original signal level by adjusting the gain of the analog signal output from the DAC 405. Herein, the analog gain compensator 407 can regulate the gain of the analog signal in any position after the DAC 405. Namely, the analog gain compensator 407 can control the gain of the analog signal in an Intermediate Frequency (IF) stage or in a Radio Frequency (RF) stage.

Herein, the digital gain normalizer 403 and the analog gain compensator 407 can regulate the gain of the corresponding signal by multiplying, for example, the corresponding signal by the DG or the AG, or control the gain of the corresponding signal according to the DG or the AG by using a lookup table of Table 1. The digital gain normalizer 403 and the analog gain compensator 407 may control the signal gain by using a bit shift or a rounding.

The digital gain normalizer 403 and the analog gain compensator 407 may control, for example, the gain of the corresponding signal using a continuous gain control or a discrete gain control. The continuous gain control applies the DG and the AG provided from the DRP 401 to the signal gain control. While the continuous gain control features the precise power level control of the signal fed to the DAC 405, the size of the table for the gain control is increased because of the DG and AG calculation in every allocation. By contrast, the discrete gain control applies the DG and the AG provided from the DRP 401 by parting the DG and the AG at regular intervals. Since 1 bit substantially corresponds to 6.02 dB of the signal, the occupying bits are not changed in the change below 6.02 dB by quantizing at intervals of 6.02 dB. Thus, the discrete gain control can drastically reduce the table size for the gain control, compared to the continuous gain control.

Equation (6) hereinbelow expresses the conversion from the continuous gain to the discrete gain.

$$\text{Discrete gain} = -\text{FLOOR}(ABS(\text{Continuous gain})/6.02) * 6.02 \quad (6)$$

In Equation (6), FLOOR( ) comprises a function for rounding down and ABS( ) is a function indicative of an absolute value.

Table 1 shows the continuous gain and the discrete gain based on the subcarrier allocation information in a system having the allocation ratio Ralloc 100 by way of example.

TABLE 1

| NAlloc/Nmin | continuous gain | bit | discrete gain |
|---|---|---|---|
| 100 | −20.00 | −3 | −18.06 |
| 99 | −19.96 | −3 | −18.06 |
| 98 | −19.91 | −3 | −18.06 |
| 97 | −19.87 | −3 | −18.06 |
| 96 | −19.82 | −3 | −18.06 |
| 95 | −19.78 | −3 | −18.06 |
| 94 | −19.73 | −3 | −18.06 |
| 93 | −19.68 | −3 | −18.06 |
| 92 | −19.64 | −3 | −18.06 |
| 91 | −19.59 | −3 | −18.06 |
| 90 | −19.54 | −3 | −18.06 |
| 89 | −19.49 | −3 | −18.06 |
| 88 | −19.44 | −3 | −18.06 |
| 87 | −19.40 | −3 | −18.06 |
| 86 | −19.34 | −3 | −18.06 |
| 85 | −19.29 | −3 | −18.06 |
| 84 | −19.24 | −3 | −18.06 |
| 83 | −19.19 | −3 | −18.06 |
| 82 | −19.14 | −3 | −18.06 |
| 81 | −19.08 | −3 | −18.06 |
| 80 | −19.03 | −3 | −18.06 |
| 79 | −18.98 | −3 | −18.06 |
| 78 | −18.92 | −3 | −18.06 |
| 77 | −18.86 | −3 | −18.06 |
| 76 | −18.81 | −3 | −18.06 |
| 75 | −18.75 | −3 | −18.06 |
| 74 | −18.69 | −3 | −18.06 |
| 73 | −18.63 | −3 | −18.06 |
| 72 | −18.57 | −3 | −18.06 |
| 71 | −18.51 | −3 | −18.06 |
| 70 | −18.45 | −3 | −18.06 |
| 69 | −18.39 | −3 | −18.06 |
| 68 | −18.33 | −3 | −18.06 |
| 67 | −18.26 | −3 | −18.06 |
| 66 | −18.20 | −3 | −18.06 |
| 65 | −18.13 | −3 | −18.06 |
| 64 | −18.06 | −3 | −18.06 |
| 63 | −17.99 | −2 | −12.04 |
| 62 | −17.92 | −2 | −12.04 |
| 61 | −17.85 | −2 | −12.04 |
| 60 | −17.78 | −2 | −12.04 |
| 59 | −17.71 | −2 | −12.04 |
| 58 | −17.63 | −2 | −12.04 |
| 57 | −17.56 | −2 | −12.04 |
| 56 | −17.48 | −2 | −12.04 |
| 55 | −17.40 | −2 | −12.04 |
| 54 | −17.32 | −2 | −12.04 |
| 53 | −17.24 | −2 | −12.04 |
| 52 | −17.16 | −2 | −12.04 |
| 51 | −17.08 | −2 | −12.04 |
| 50 | −16.99 | −2 | −12.04 |
| 49 | −16.90 | −2 | −12.04 |
| 48 | −16.81 | −2 | −12.04 |
| 47 | −16.72 | −2 | −12.04 |
| 46 | −16.63 | −2 | −12.04 |
| 45 | −16.53 | −2 | −12.04 |
| 44 | −16.43 | −2 | −12.04 |
| 43 | −16.33 | −2 | −12.04 |
| 42 | −16.23 | −2 | −12.04 |
| 41 | −16.13 | −2 | −12.04 |
| 40 | −16.02 | −2 | −12.04 |
| 39 | −15.91 | −2 | −12.04 |
| 38 | −15.80 | −2 | −12.04 |
| 37 | −15.68 | −2 | −12.04 |
| 36 | −15.56 | −2 | −12.04 |
| 35 | −15.44 | −2 | −12.04 |
| 34 | −15.31 | −2 | −12.04 |
| 33 | −15.19 | −2 | −12.04 |
| 32 | −15.05 | −2 | −12.04 |
| 31 | −14.91 | −2 | −12.04 |
| 30 | −14.77 | −2 | −12.04 |
| 29 | −14.62 | −2 | −12.04 |
| 28 | −14.47 | −2 | −12.04 |

TABLE 1-continued

| NAlloc/Nmin | continuous gain | bit | discrete gain |
|---|---|---|---|
| 27 | −14.31 | −2 | −12.04 |
| 26 | −14.15 | −2 | −12.04 |
| 25 | −13.98 | −2 | −12.04 |
| 24 | −13.80 | −2 | −12.04 |
| 23 | −13.62 | −2 | −12.04 |
| 22 | −13.42 | −2 | −12.04 |
| 21 | −13.22 | −2 | −12.04 |
| 20 | −13.01 | −2 | −12.04 |
| 19 | −12.79 | −2 | −12.04 |
| 18 | −12.55 | −2 | −12.04 |
| 17 | −12.30 | −2 | −12.04 |
| 16 | −12.04 | −2 | −12.04 |
| 15 | −11.76 | −1 | −6.02 |
| 14 | −11.46 | −1 | −6.02 |
| 13 | −11.14 | −1 | −6.02 |
| 12 | −10.79 | −1 | −6.02 |
| 11 | −10.41 | −1 | −6.02 |
| 10 | −10.00 | −1 | −6.02 |
| 9 | −9.54 | −1 | −6.02 |
| 8 | −9.03 | −1 | −6.02 |
| 7 | −8.45 | −1 | −6.02 |
| 6 | −7.78 | −1 | −6.02 |
| 5 | −6.99 | −1 | −6.02 |
| 4 | −6.02 | −1 | −6.02 |
| 3 | −4.77 | 0 | 0 |
| 2 | −3.01 | 0 | 0 |
| 1 | 0.00 | 0 | 0 |

In the allocation from 1 to 100 as shown in Table 1, the continuous gain control requires 100 sub-tables (i.e. cells or rows), whereas the discrete gain control requires merely 4 sub-tables (1, −6.02, −12.4 and −18.6). As one can see, the discrete gain control is more efficient than the continuous gain control.

Referring back to FIG. 4, the DRP 401 generates the DG and the AG based on the number of the signal types within one TTI and the digital gain normalizer 403 and the analog gain compensator 407 control the signal gain using the generated DG and AG. In doing so, the number of DAC bits required at the DAC 405 will now be explained hereinbelow.

Figure 5:
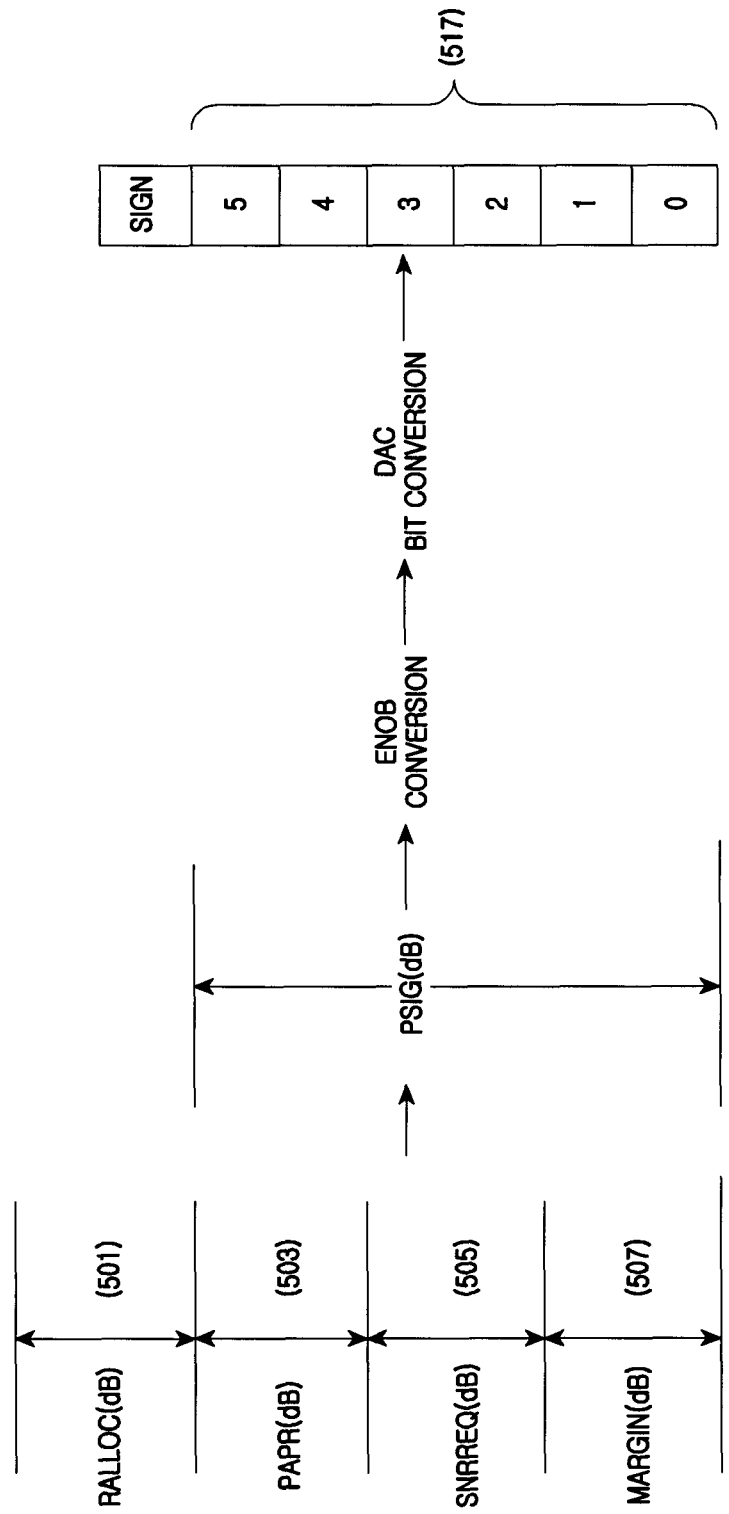
FIG. 5 is a diagram of the determination of the number of DAC bits for a single signal type at the transmitter of the FDMA system according to an exemplary embodiment of the present invention.

As shown in FIG. 5, when there is only a single signal type within one TTI, the number of the DAC bits is determined by the PAPR 503, the required SNR SNRreq 505, and the margin 507 regardless of the allocation information Ralloc 501.

Equation (7) below expresses the number of the DAC bits required for one signal type in one TTI.

$$\text{DAC bits} = \text{ceil}(\text{ENOB})$$

$$\text{ENOB} = (P_{sig} - 1.76)/6.02 \tag{7}$$

$$P_{sig}(\text{dB}) = \text{SNRreq}(\text{dB}) + \text{PAPR}(\text{dB}) + \text{Margin}(\text{dB})$$

In Equation (7), ceil( ) denotes a function for rounding up to the nearest integer, ENOB denotes an effective number of bits, and Psig denotes a dB scale value.

More specifically, when there is only one signal type in the TTI, there are enough DAC bits 517 to accommodate the PAPR 503, the SNRreq 505, and the margin 507, excluding the Ralloc 501, are simply required as shown in FIG. 5, which are smaller than the conventional DAC bits including all of the Ralloc 501, the PAPR 503, the SNRreq 505, and the margin 507.

Figure 6:
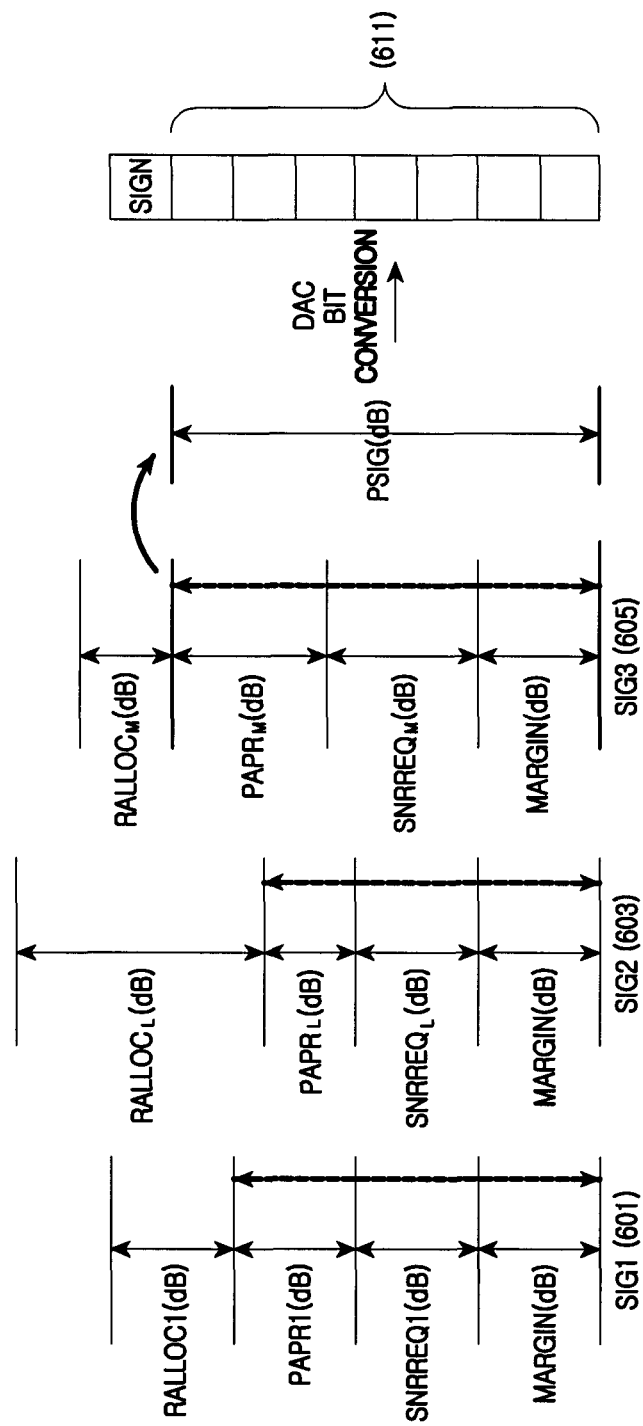
FIG. 6 is a diagram of the determination of the number of DAC bits for signals of two or more types at the transmitter of the FDMA system according to an exemplary embodiment of the present invention.

Now, when there are various signals in the TTI, the number of the DAC bits can be determined by the PAPR, the required SNR SNRreq, and the margin of each signal, regardless of the allocation information Ralloc, as shown in FIG. 6. Particularly, amongst the various signals $Sig_1$ 601, $Sig_2$ 603, and $Sig_3$ 605, the DAC bits are determined by the signal $\text{Sig}_3$ 605 having the greatest sum of the PAPR, the required SNR SNRreq, and the margin.

Equation (8) expresses the number of the DAC bits in case of the various signals in one TTI.

DAC bits=ceil(ENOB)

ENOB=$(P_{sig}-1.76)/6.02$ $$P_{sig}(\text{dB})=\text{SNRreq}_M(\text{dB})+\text{PAPR}_M(\text{dB})+\text{Margin}(\text{dB}) \quad (8)$$

In Equation (8), ceil( ) denotes a function for rounding up to the nearest integer, ENOB denotes an effective number of bits, and Psig denotes a dB scale value.

As shown in FIG. 6, in case of the various signals in one TTI, the number of DAC bits 611 shown is needed for the signal $\text{Sig}_3$ 605, which requires the greatest number of DAC bits, because this number represents the greatest sum of the PAPR, the SNRreq, and the margin amongst the various signals $\text{Sig}_1$ 601, $\text{Sig}_2$ 603, and $\text{Sig}_3$ 605. Ultimately, the required number of DAC bits is smaller than the number of conventional DAC bits, including the greatest Ralloc, PAPR, SNRreq, and the margin of the various signals.

Now, positions and operations of the digital gain normalizer 403 for controlling the gain of the signal input to the DAC 405 and the analog gain compensator 407 for controlling the gain of the signal output from the DAC 405 (shown in FIG. 4) are described in detail.

Figure 7:
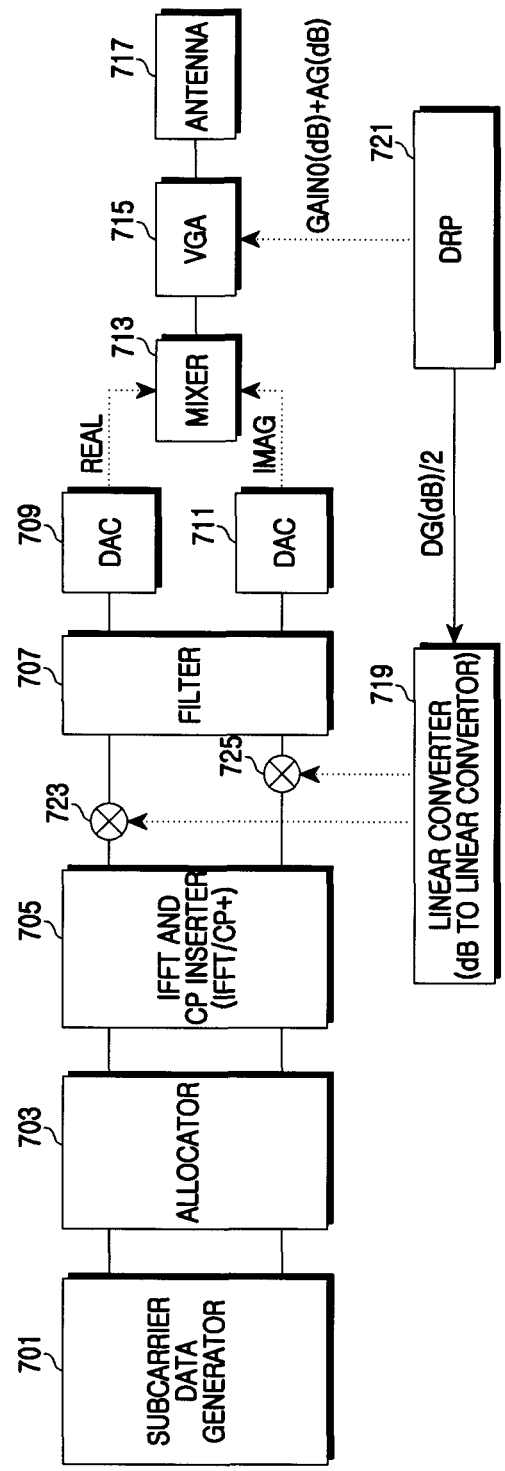
FIG. 7 is a block diagram of the transmitter in the FDMA system according to an exemplary embodiment of the present invention.

FIG. 7 is a block diagram of the transmitter in the FDMA system according to an exemplary embodiment of the present invention. The transmitter of FIG. 7 includes a subcarrier data generator 701, an allocator 703, an Inverse Fast Fourier Transformer (IFFT) and Cyclic Prefix (CP) inserter 705, a filter 707, DACs 709 and 711, multipliers 723 and 725, a mixer 713, a Variable Gain Amplifier (VGA) 715, an antenna 717, a DRP 721, and a linear converter 719.

The subcarrier data generator 701 generates transmit symbols by coding data for transmission and also maps the subcarriers to the generated transmit symbols. The allocator 703 attributes the transmit symbols to an intended frequency band. The IFFT and the CP inserter 705 performs the Inverse Fast Fourier Transform and inserts a CP into the transmit symbol. Herein, the subcarrier data generator 701 of the OFDM system includes an encoder and a mapper, and the subcarrier data generator 701 of the SC-FDMA system includes the encoder, the mapper, and a Discrete Fourier Transformer (DFT).

The multipliers 723 and 725 multiply the transmit symbols output from the IFFT and CP inserter 705 by a gain control value output from the linear converter 719 and provides the product to the filter 707. The linear converter 719 converts the dB-unit DG output from the DRP 721 to a linear scale and provides the converted DG to the multipliers 723 and 725. Herein, the multipliers 723 and 725 and the linear converter 719 are the implementation of the digital gain normalizer 403 of FIG. 4.

The DRP 721 generates the DG and the AG based on Equations (2) or Equations (4) and (5), according to the signal type in one TTI, and outputs the generated AG to the VGA 715, and the generated DG to the linear converter 719. By providing the generated DG to the linear converter 719, the DRP 721 is reduced by approximately half the DG value in order to regulate separately the sizes of the real part and the imaginary part of the signal. The DRP 721 provides the AG to the VGA 715 together with a GAINO which is a given gain in the RF stage.

Still referring to FIG. 7, the filter 707 filters the transmit symbols output from the multipliers 723 and 725 and outputs the filtered transmit symbols to the DAC 709. The filter 707 preferably comprises, for example, a spectrum shaping filter. If necessary, the filter 707 can include a windowing, an interpolation filter, an inverse sync filter, and a PAPR reduction filter. Herein, since the signal gain is controlled by the multipliers 723 and 725 in front of the filter 707, the number of bits within the filter 707 can be reduced.

The DACs 709 and 711 convert the input digital signal to an analog signal, and output the analog signal to the mixer 713. The mixer 713 converts the input signals to RF signals and outputs the RF signals to the VGA 715.

The VGA 715, which is the implementation of the analog gain compensator 407 of FIG. 4, receives the AG from the DRP 721 to control the gain of the analog signal, restores the original signal by controlling the gain of the signal output from the mixer 713, and outputs the signal to the antenna 717.

In FIG. 7, the multipliers 723 and 725 are interposed between the IFFT and CP inserter 705 and the filter 707 to control the gain of the signal output from the IFFT and CP inserter 705. Yet, the multipliers 723 and 725 may be interposed between the filter 707 and the DAC 709 to control the gain of the signal output from the filter 707 and forward the signal to the DAC 709. When the multipliers 723 and 725 are positioned in front of the filter 707, the number of the required bits of the filter 707 can be reduced in addition to the number of the required bits of the DAC 709. Accordingly, it is advantageous and thus preferable that the multipliers 723 and 725 should be interposed between the IFFT and CP inserter 705 and the filter 707.

Figure 8:
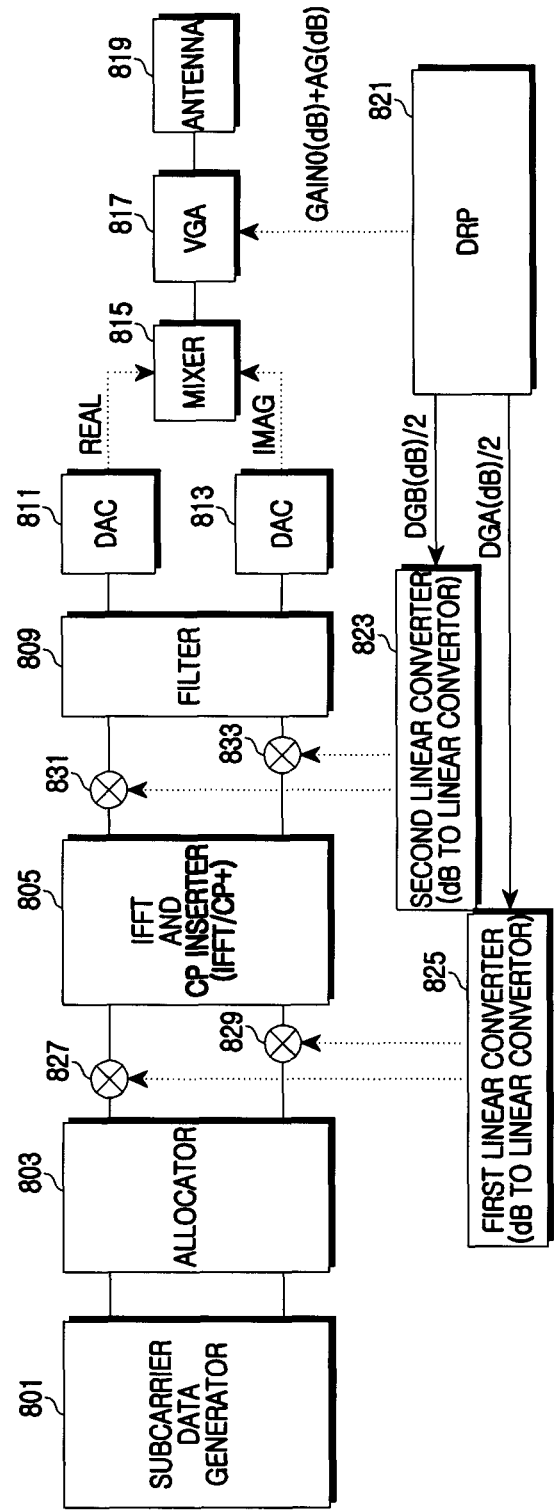
FIG. 8 is a block diagram of a transmitter in the FDMA system according to another exemplary embodiment of the present invention.

FIG. 8 is a block diagram of a transmitter in the FDMA system according to another exemplary embodiment of the present invention. The exemplary transmitter of FIG. 8 includes a subcarrier data generator 801, an allocator 803, an IFFT and CP inserter 805, a filter 809, DACs 811 and 813, a mixer 815, a VGA 817, an antenna 819, a DRP 821, a first linear converter 825, a second linear converter 823, first multipliers 827 and 829, and second multipliers 831 and 833.

Unlike the transmitter of FIG. 7, the transmitter of FIG. 8 controls the gain of the digital signal both before and after the IFFT. More specifically, the gain of the signal input to the IFFT and CP inserter 805 is controlled through the first linear converter 825 and the first multipliers 827 and 829, and the gain of the signal output from the IFFT and CP inserter 805 is controlled through the second linear converter 823 and the second multipliers 831 and 833. Thus, the signal level is normalized to the constant level.

After generating the DG, the DRP 821 divides the generated DG into DGa which is the gain multiplied according to the allocation amount, and DGb which is the normal value. The DRP 821 provides the DGa to the first linear converter 825 and provides the DGb to the second linear converter 823.

Still referring to FIG. 8, the DRP 821 divides the generated DG into the DGa for controlling the maximum allocable amount at the ratio of the normal allocation to the current allocation and the DGb for the normalization and controls the signal gain before and after the IFFT stage. In the SC-FDMA system, the number of the bits of the IFFT stage increases but the number of the bits of the DFT stage can be reduced. That is, the hardware size of the IFFT stage increases, whereas the hardware size of the DFT stage reduces. Since the DFT hardware size is usually bigger than the IFFT hardware size, the increased hardware size of the IFFT stage and the decreased hardware size of the DFT stage can reduce the total hardware size.

Figure 9:
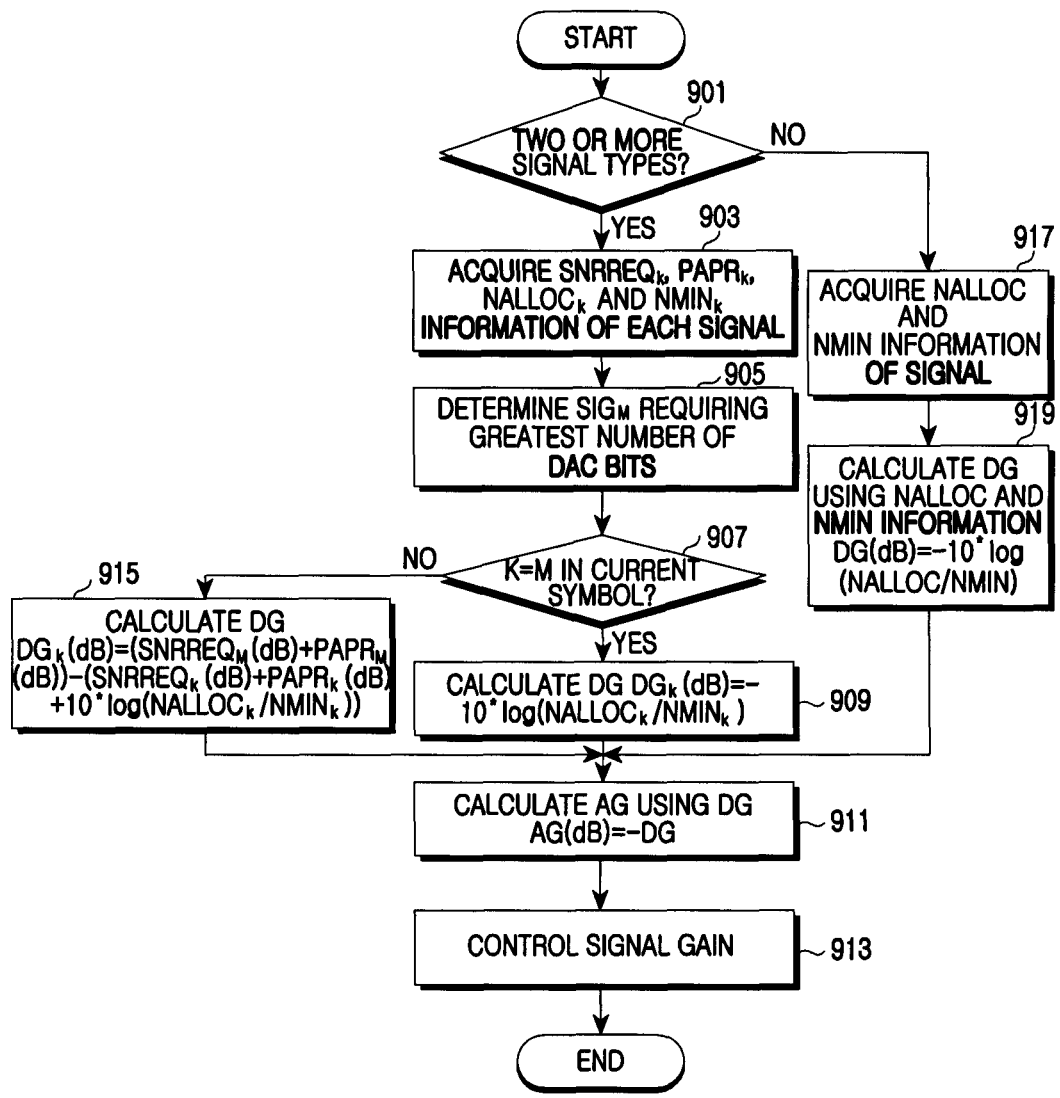
FIG. 9 is a flowchart of a method for regulating the signal gain to decrease the number of the DAC bits in the FDMA system according to an exemplary embodiment of the present invention.

FIG. 9 is a flowchart providing a general exemplary overview of a method for regulating the signal gain to decrease the number of the DAC bits in the FDMA system according to an exemplary embodiment of the present invention.

In step 901, the transmitter checks whether or not there are two or more signal types in one TTI.

When it is determined at step 901 that there is one signal type in the TTI, the transmitter acquires the subcarrier allocation information of the signal; that is, the number of the subcarriers currently allocated Nalloc and the minimum number of the allocated subcarriers Nmin in step 917. The transmitter calculates the digital gain DG using the number of the subcarriers currently allocated Nalloc and the minimum number of the allocated subcarriers Nmin based on Equation (2) in step 919 and goes to step 911.

By contrast, when it is determined at step 901 that there are two or more signal types in the TTI, the transmitter acquires the required SNR, PAPR, Nalloc, and Nmin information of the various signals in the TTI in step 903 and examines the index M of the signal requiring the greatest number of the DAC bits based on Equation (3) in step 905.

Next, the transmitter checks whether or not the index k of the current symbol matches the index M of the signal requiring the greatest number of the DAC bits in step 907.

When the index k of the current symbol matches the index M of the signal requiring the greatest number of the DAC bits at step 907, the transmitter calculates the DG based on Equation (4) in step 909 and proceeds to step 911.

When the index k of the current symbol does not match the index M of the signal requiring the greatest number of the DAC bits, the transmitter calculates the DG based on Equation (5) in step 915 and goes to step 911.

After calculating the AG using the DG in step 911, the transmitter normalizes the power level of the signal to the constant level by regulating the gain of the signal input to the DAC 405 using the DG and restores the original signal by regulating the gain of the signal output from the DAC 405 using the AG in step 913, and then finishes this process.

In light of the foregoing as set forth above, the transmitter of the SC-FDMA system or the OFDMA system controls the power level of the signal input to the DAC to a constant level. Therefore, in the conversion from the digital signal to the analog signal, the number of the necessary bits for conversion can be reduced and the cost and the consumed power can be saved.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for reducing Digital-to-Analog Conversion (DAC) bits at a transmitter of a Frequency Division Multiple Access (FDMA) system, the method comprising:
  (a) generating a digital signal gain control value and an analog signal gain control value using subcarrier allocation information, a required Signal to Noise Ratio (SNR), and a Peak to Average Power Ratio (PAPR), the analog signal gain control value being inversely related to the digital signal gain control value;
  (b) controlling a gain of a signal input to a digital-to-analog converter by the digital signal gain control value generated in (a) to reduce a number of DAC bits;
  (c) converting a digital signal of the controlled gain in (b) into an analog signal by the digital-to-analog converter; and
  (d) restoring an original signal level by controlling a gain of a signal output from the digital-to-analog converter using the analog signal gain control value from (a),
  wherein the digital signal gain control value is a function of a ratio of Nalloc to Nmin, where Nalloc denotes a number of the subcarriers currently allocated, and Nmin denotes a minimum number of allocated subcarriers comprising a minimum allocation subcarrier unit.

2. The method of claim 1, wherein the subcarrier allocation information comprises at least one of a number of subcarriers currently allocated and a minimum number of allocated subcarriers.

3. The method of claim 1, including calculating, when there is one signal type in one Transmission Time Interval (TTI), the digital signal gain control value and the analog signal gain control value based on the following equation:

$$DG(\text{dB}) = -10 * \log(Nalloc/Nmin)$$

$$AG(\text{dB}) = -DG(\text{dB})$$

where DG denotes the digital signal gain control value, and AG denotes the analog signal gain control value.

4. The method of claim 1, wherein the controlling of the gain of the signal input to the digital-to-analog converter in step (b) comprises:
  (i) controlling the gain of a signal which passes through an Inverse Fast Fourier Transform (IFFT) and a Cyclic Prefix (CP) using the digital signal gain control value; and
  (ii) filtering the gain-controlled signal and providing the filtered signal to the digital-to-analog converter.

5. A method for reducing Digital-to-Analog Conversion (DAC) bits at a transmitter of a Frequency Division Multiple Access (FDMA) system, the method comprising:
  (a) generating a digital signal gain control value and an analog signal gain control value using subcarrier allocation information, a required Signal to Noise Ratio (SNR), and a Peak to Average Power Ratio (PAPR), the analog signal gain control value being inversely related to the digital signal gain control value;
  (b) controlling a gain of a signal input to a digital-to-analog converter by the digital signal gain control value generated in (a) to reduce a number of DAC bits;
  (c) converting a digital signal of the controlled gain in (b) into an analog signal by the digital-to-analog converter; and
  (d) restoring an original signal level by controlling a gain of a signal output from the digital-to-analog converter using the analog signal gain control value from (a),
  wherein said generating a digital signal gain control value and an analog signal gain control value comprises calculating, when there are a plurality of signal types in one Transmission Time Interval (TTI), the digital signal gain control value and the analog signal gain control value by examining a signal which requires a largest number of digital-to-analog converter (DAC) bits based on the following equation and checking whether or not a corresponding symbol matches the examined signal:

$$M = \underset{k}{\operatorname{argmax}}(SNReq k_k(\text{dB}) + PAPR_k(\text{dB})), \; k = 1, 2, \ldots, N$$

where M denotes an index of the signal requiring the largest number of the DAC bits among the plurality of signals in the TTI, $$\underset{k}{\operatorname{argmax}}()$$

denotes a function indicative of a value k which maximizes a value in the parenthesis, $SNRreqk_k$ denotes a required SNR of the signal of the index k, and $PAPR_k$ denotes a PAPR value of the signal of the index k.

6. The method of claim 5, further comprising calculating when the corresponding symbol matches the signal requiring the greatest number of the DAC bits, the digital signal gain control value and the analog signal gain control value based on the following equation:

$$DG_k(\text{dB})=-10*\log(Nalloc_k/N\min_k)$$

$$AG_k(\text{dB})=-DG_k(\text{dB})$$

where DG denotes the digital signal gain control value, AG denotes the analog signal gain control value, Nalloc denotes a number of the subcarriers currently allocated, and N min denotes a minimum number of the allocated subcarriers comprising a minimum allocation subcarrier unit.

7. The method of claim 5, wherein, when the corresponding symbol does not match the signal requiring the largest number of DAC bits, the digital signal gain control value and the analog signal gain control value are calculated based on the following equation:

$$DG_k(\text{dB})=(SNRreq_M(\text{dB})+PAPR_M(\text{dB}))-(SNRreq_k(\text{dB})+PAPR_k(\text{dB})+10*\log(Nalloc_k/N\min_k))$$

$$AG_k(\text{dB})=-DG_k(\text{dB}) \qquad (5)$$

where DG denotes the digital signal gain control value, AG denotes the analog signal gain control value, Nalloc denotes a number of the subcarriers currently allocated, and N min denotes a minimum number of the allocated subcarriers comprising a minimum allocation subcarrier unit.

8. An apparatus for reducing Digital to Analog Conversion (DAC) bits at a transmitter of a Frequency Division Multiple Access (FDMA) system, the apparatus comprising:
a dynamic range preprocessor for generating a digital signal gain control value and an analog signal gain control value using subcarrier allocation information, a required Signal to Noise Ratio (SNR), and a Peak to Average Power Ratio (PAPR), the analog signal gain control value being inversely related to the digital signal gain control value;
a digital gain normalizer for receiving the digital gain control value generated by the dynamic range preprocessor and for controlling a gain of a signal output to a digital-to-analog converter to reduce a number of DAC bits;
wherein said digital-to-analog converter is for converting a digital signal of the controlled gain to an analog signal according to the digital signal gain control value; and
an analog gain compensator for restoring an original signal level by controlling a gain of a signal output from the digital-to-analog converter using the analog signal gain control value;
wherein the digital signal gain control value is a function of a ratio of Nalloc to Nmin, where Nalloc denotes a number of the subcarriers currently allocated, and Nmin denotes a minimum number of allocated subcarriers comprising a minimum allocation subcarrier unit.

9. The apparatus of claim 8, wherein the subcarrier allocation information comprises at least one of a number of subcarriers currently allocated and a minimum number of allocated subcarriers.

10. The apparatus of claim 8, wherein, when there is one signal type in one Transmission Time Interval (TTI), the dynamic range preprocessor calculates the digital signal gain control value and the analog signal gain control value based on the following equation:

$$DG(\text{dB})=-10*\log(Nalloc/N\min)$$

$$AG(\text{dB})=-DG(\text{dB}) \qquad (2)$$

where DG denotes the digital signal gain control value, and AG denotes the analog signal gain control value.

11. The apparatus of claim 8, wherein the digital gain normalizer is interposed between an Inverse Fast Fourier Transformer (IFFT) and a filter for controlling a gain of an IFFT-processed signal and provides the IFFT-processed signal to the filter.

12. The apparatus of claim 8, wherein the digital gain normalizer is disposed both before and after an Inverse Fast Fourier Transformer (IFFT) for controlling a gain of a signal input to the IFFT and for controlling a gain of a signal output from the IFFT.

13. The apparatus of claim 8, wherein the digital gain normalizer comprises:
a converter for converting the digital gain control value output from the dynamic range preprocessor to a linear scale; and
a multiplier for multiplying a signal input to the digital-to-analog converter by the digital gain control value converted to a linear scale.

14. An apparatus for reducing Digital to Analog Conversion (DAC) bits at a transmitter of a Frequency Division Multiple Access (FDMA) system, the apparatus comprising:
a dynamic range preprocessor for generating a digital signal gain control value and an analog signal gain control value using subcarrier allocation information, a required Signal to Noise Ratio (SNR), and a Peak to Average Power Ratio (PAPR), the analog signal gain control value being inversely related to the digital signal gain control value;
a digital gain normalizer for receiving the digital gain control value generated by the dynamic range preprocessor and for controlling a gain of a signal output to a digital-to-analog converter to reduce a number of DAC bits;
wherein said digital-to-analog converter is for converting a digital signal of the controlled gain to an analog signal according to the digital signal gain control value; and
an analog gain compensator for restoring an original signal level by controlling a gain of a signal output from the digital-to-analog converter using the analog signal gain control value;
wherein, when there are a plurality of signal types in one TTI, the dynamic range preprocessor examines a signal which requires a largest number of DAC bits based on the following equation and calculates the digital signal gain control value and the analog signal gain control value by checking whether or not a corresponding symbol matches the examined signal:

$$M = \underset{k}{\operatorname{argmax}}(SNRreqk_k(\text{dB}) + PAPR_k(\text{dB})), \; k = 1, 2, \ldots, N$$

where M denotes an index of the signal requiring the greatest number of the DAC bits among the plurality of signals in the TTI, $$\underset{k}{\mathrm{argmax}}()$$

denotes a function indicative of a value k which maximizes a value in the parenthesis, $SNRreqk_k$ denotes a required SNR of the signal of the index k, and $PAPR_k$ denotes a PAPR value of the signal of the index k.

15. The apparatus of claim 14, wherein, when the corresponding symbol matches the signal requiring the greatest number of the DAC bits, the dynamic range preprocessor calculates the digital signal gain control value and the analog signal gain control value based on the following equation:

$$DG(\mathrm{dB}) = -10*\log(Nalloc/N\mathrm{min})$$

$$AG(\mathrm{dB}) = -DG(\mathrm{dB}) \quad (2)$$

where DG denotes the digital signal gain control value, AG denotes the analog signal gain control value, Nalloc denotes the number of the subcarriers currently allocated, and N min denotes the minimum number of the allocated subcarriers, comprising a minimum allocation subcarrier unit.

16. The apparatus of claim 14, wherein, when the corresponding symbol does not match the signal requiring the largest number of the DAC bits, the dynamic range preprocessor calculates the digital signal gain control value and the analog signal gain control value based on the following equation:

$$DG_k(\mathrm{dB}) = (SNRreq_M(\mathrm{dB}) + PAPR_M(\mathrm{dB})) - (SNRreq_k(\mathrm{dB}) + PAPR_k(\mathrm{dB}) + 10*\log(Nalloc_k/N\mathrm{min}_k))$$

$$AG_k(\mathrm{dB}) = -DG_k(\mathrm{dB}) \quad (5)$$

where DG denotes the digital signal gain control value, AG denotes the analog signal gain control value, Nalloc denotes the number of the subcarriers currently allocated, and N min denotes the minimum number of the allocated subcarriers comprising a minimum allocation subcarrier unit.

* * * * *

UNITED STATES PATENT AND TRADEMARK OFFICE
CERTIFICATE OF CORRECTION

PATENT NO. : 8,493,954 B2
APPLICATION NO. : 12/337702
DATED : July 23, 2013
INVENTOR(S) : Jun-Kyu Kang et al.

It is certified that error appears in the above-identified patent and that said Letters Patent is hereby corrected as shown below:

In the Claims:

Column 14, Claim 11, Line 20 should read as follows:
--...IFFT-processed signal, and...--

Column 15, Claim 15, Lines 19-21 should read as follows:
--...
$$DG_k(dB) = -10 * \log(Nalloc_k / N\min_k)$$
$$AG_k(dB) = -DG_k(dB)$$
...--

Signed and Sealed this
Twenty-fourth Day of September, 2013

Teresa Stanek Rea
*Deputy Director of the United States Patent and Trademark Office*